United States Patent
Moschiano et al.

(10) Patent No.: US 9,520,183 B2
(45) Date of Patent: Dec. 13, 2016

(54) THRESHOLD VOLTAGE COMPENSATION IN A MEMORY

(71) Applicant: Micron Technology, Inc., Boise, ID (US)

(72) Inventors: Violante Moschiano, Bacoli (IT); Tommaso Vali, Sezze (IT); Giovanni Naso, Frosinone (IT); Vishal Sarin, Cupertino, CA (US); William Henry Radke, Los Gatos, CA (US); Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/707,684

(22) Filed: May 8, 2015

(65) Prior Publication Data
US 2015/0243351 A1    Aug. 27, 2015

Related U.S. Application Data

(62) Division of application No. 13/219,439, filed on Aug. 26, 2011, now Pat. No. 9,030,870.

(51) Int. Cl.
G11C 11/34    (2006.01)
G11C 16/04    (2006.01)
(Continued)

(52) U.S. Cl.
CPC ........ G11C 11/5621 (2013.01); G11C 11/5628 (2013.01); G11C 11/5642 (2013.01);
(Continued)

(58) Field of Classification Search
CPC .. G11C 16/26; G11C 11/5628; G11C 11/5642; G11C 16/3427; G11C 16/3418; G11C 16/24
(Continued)

(56) References Cited

U.S. PATENT DOCUMENTS 5,508,958 A    4/1996    Fazio et al.
5,867,429 A    2/1999    Chen et al.
(Continued)

FOREIGN PATENT DOCUMENTS

CN    101385089 A    3/2009
CN    101405812 A    4/2009
(Continued)

OTHER PUBLICATIONS

"International Application Serial No. PCT/US2012/052333, International Preliminary Report on Patentability mailed Mar. 13, 2014", 8 pgs.
(Continued)

Primary Examiner — Toan Le
(74) Attorney, Agent, or Firm — Schwegman Lundberg & Woessner, P.A.

(57) ABSTRACT

Threshold voltages in a charge storage memory are controlled by threshold voltage placement, such as to provide more reliable operation and to reduce the influence of factors such as neighboring charge storage elements and parasitic coupling. Pre-compensation or post-compensation of threshold voltage for neighboring programmed "aggressor" memory cells reduces the threshold voltage uncertainty in a flash memory system. Using a buffer having a data structure such as a lookup table provides for programmable threshold voltage distributions that enables the distribution of data states in a multi-level cell flash memory to be tailored, such as to provide more reliable operation.

20 Claims, 10 Drawing Sheets

(51) Int. Cl.
*G11C 11/56* (2006.01)
*G11C 16/34* (2006.01)
*G11C 16/24* (2006.01)
*G11C 16/26* (2006.01)

(52) U.S. Cl.
CPC .......... *G11C 16/0483* (2013.01); *G11C 16/24* (2013.01); *G11C 16/26* (2013.01); *G11C 16/3418* (2013.01); *G11C 16/3427* (2013.01); *G11C 2211/5641* (2013.01)

(58) Field of Classification Search
USPC .................. 365/185.03, 185.18, 185.19, 185.24, 365/185.25
See application file for complete search history.

(56) References Cited

U.S. PATENT DOCUMENTS

| | | | |
|---|---|---|---|
| 6,154,157 | A | 11/2000 | Wong |
| 7,460,398 | B1 | 12/2008 | Roohparvar et al. |
| 7,463,514 | B1 | 12/2008 | Haque et al. |
| 7,577,034 | B2 | 8/2009 | Lee et al. |
| 7,630,246 | B2 | 12/2009 | Roohparvar |
| 7,684,237 | B2 | 3/2010 | Moschiano et al. |
| 7,800,951 | B2 | 9/2010 | Sutardja |
| 7,936,599 | B2 | 5/2011 | Roohparvar et al. |
| 7,944,754 | B2 | 5/2011 | Cernea |
| 8,116,141 | B2 | 2/2012 | Yoo et al. |
| 8,451,664 | B2 | 5/2013 | Radke et al. |
| 9,030,870 | B2 | 5/2015 | Moschiano et al. |
| 9,076,547 | B2 | 7/2015 | Moschiano et al. |
| 9,087,594 | B2 | 7/2015 | Moschiano et al. |
| 2002/0110019 | A1* | 8/2002 | Satoh ................. G11C 11/5621 365/185.03 |
| 2008/0253188 | A1 | 10/2008 | Aritome |
| 2008/0253193 | A1 | 10/2008 | Cernea |
| 2008/0273384 | A1 | 11/2008 | Sarin et al. |
| 2009/0073771 | A1 | 3/2009 | Li |
| 2009/0106482 | A1 | 4/2009 | Sarin |
| 2009/0141558 | A1 | 6/2009 | Sarin et al. |
| 2009/0290426 | A1 | 11/2009 | Moschiano et al. |
| 2010/0074026 | A1 | 3/2010 | Kang |
| 2010/0149868 | A1 | 6/2010 | Yoo et al. |
| 2010/0265764 | A1 | 10/2010 | Yoo et al. |
| 2010/0299475 | A1* | 11/2010 | Yano ................... G11C 11/5628 711/103 |
| 2010/0321995 | A1 | 12/2010 | Sarin |
| 2010/0321999 | A1 | 12/2010 | Yoo et al. |
| 2011/0141815 | A1 | 6/2011 | Haratsch et al. |
| 2013/0033937 | A1 | 2/2013 | Aritome et al. |
| 2013/0051141 | A1 | 2/2013 | Moschiano et al. |
| 2013/0058164 | A1 | 3/2013 | Moschiano et al. |
| 2013/0265827 | A1 | 10/2013 | Moschiano et al. |
| 2015/0302931 | A1 | 10/2015 | Moschiano et al. |
| 2015/0325309 | A1 | 11/2015 | Moschiano et al. |

FOREIGN PATENT DOCUMENTS

| | | |
|---|---|---|
| CN | 101458954 A | 6/2009 |
| CN | 101861624 A | 10/2010 |
| CN | 103843068 A | 6/2014 |
| JP | 2008536251 A | 9/2008 |
| JP | 2009545093 A | 12/2009 |
| JP | 2010541119 A | 12/2010 |
| TW | 201324517 A1 | 6/2013 |
| WO | WO-2010002941 A1 | 1/2010 |
| WO | WO-2011070599 A1 | 6/2011 |
| WO | WO-2013032928 A1 | 3/2013 |

OTHER PUBLICATIONS

"International Application Serial No. PCT/US2012/052333, International Search Report mailed Jan. 30, 2013", 3 pgs.

"International Application Serial No. PCT/US2012/052333, Written Opinion mailed Jan. 30, 2013", 6 pgs.

U.S. Appl. No. 14/790,438, filed Jul. 2, 2015, Level Compensation in Multilevel Memory.

U.S. Appl. No. 14/803,918, filed Jul. 20, 2015, Memory Apparatus, Systems, and Methods.

Chinese Application Serial No. 201280048762.8, Office Action mailed Dec. 14, 2015, (English Translation), 27 pgs.

Chinese Application Serial No. 201280048762.8, Response filed Apr. 26, 2016 to Office Action mailed Dec. 14, 2015, W/ English Claims, 17 pgs.

European Application Serial No. 12828784.4, Extended European Search Report mailed Apr. 29, 2015, 8 pgs.

European Application Serial No. 12828784.4, Preliminary Amendment filed Oct. 10, 2014, 9 pgs.

European Application Serial No. 12828784.4, Response filed Nov. 4, 2015 to Extended European Search Report mailed Apr. 29, 2015, 14 pgs.

Japanese Application Serial No. 2014-527335, Notice of Rejection mailed Oct. 20, 2015, W/ Machine Translation, 10 pgs.

Japanese Application Serial No. 2014-527335, Response filed Apr. 22, 2016 to Notice of Rejection mailed Oct. 20, 2015, W/ English Claims, 11 pgs.

* cited by examiner

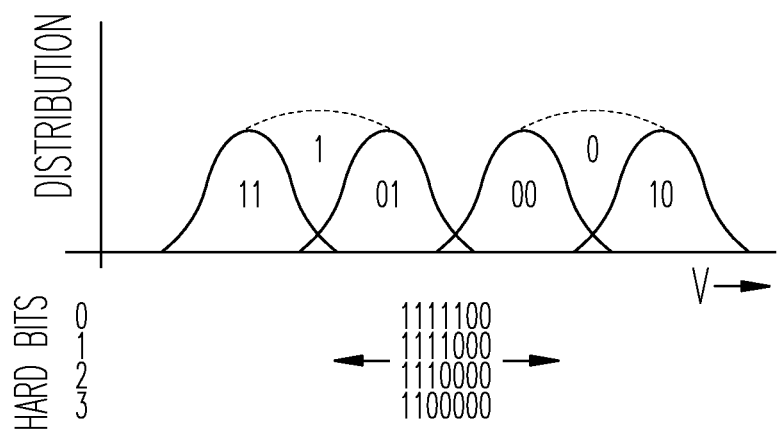
Fig. 4
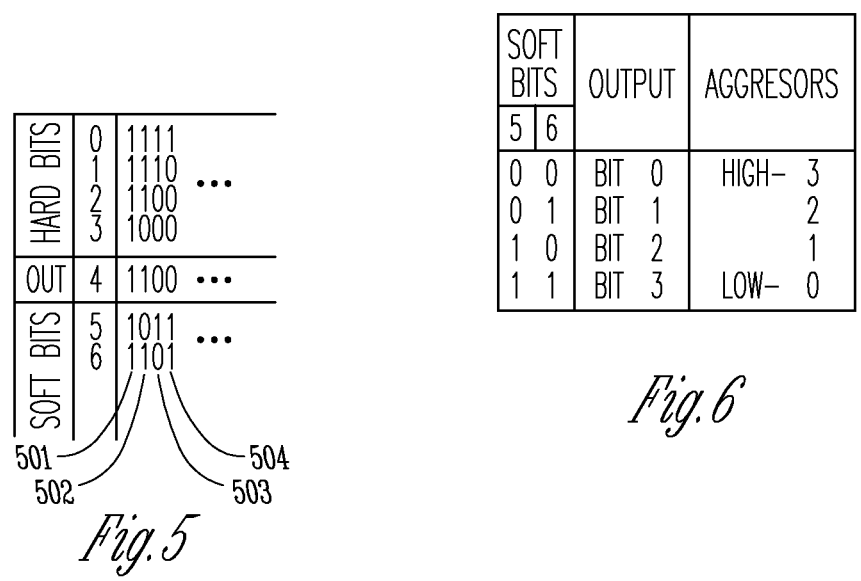
Fig. 5
Fig. 6

THRESHOLD VOLTAGE COMPENSATION IN A MEMORY

PRIORITY APPLICATION

This application is a divisional of U.S. application Ser. No. 13/219,439, filed Aug. 26, 2011, which is incorporated herein by reference in its entirety.

BACKGROUND

A variety of computer systems and electronic devices use memory that is not volatile, or does not lose the data it has stored when power is disconnected. These nonvolatile memories can be reprogrammed, read, and erased electronically, and are well suited to storing data such as music in digital audio players, pictures in digital cameras, and configuration data in cellular telephones. Such memory includes devices commonly known as flash memory, named in part because a flash operation is used to erase the content of a block of data before it is reprogrammed, and is packaged for consumer use in products such as CompactFlash memory cards, USB flash memory drives, and other such devices.

Flash memory comprises a number of cells, each of which typically stores a single binary digit or bit of information. A typical flash memory cell comprises a field effect transistor having an electrically isolated charge storage structure such as a floating gate or charge trap that controls electrical conduction between source and drain regions of the memory cell. Data is represented by a charge stored on the charge storage structure, and the resulting change in conductivity observed between the source and drain regions.

The charge storage structure separates a control gate from the source and drain regions of the memory cell. Electrons stored on the charge storage structure are insulated from the control gate and the drain and source by an insulating oxide layer partially cancel out or modify an electric field produced by the control gate, resulting in a change in the effective threshold voltage (Vt) of the memory cell. When the memory cell is read by placing a specified voltage on the control gate, the electrical impedance between the source and drain of the device will either allow or not allow current to flow, depending on the presence of a charge on the charge storage structure and the effective Vt or threshold voltage of the memory cell. The presence or absence of current above a threshold level can be sensed, and used to determine a programmed state of the memory cell, resulting in a particular data value such as a one or zero value being read.

Some flash memory cells can store more than a single bit of information per cell by using multiple threshold voltages in programming and reading the flash memory cell, and are often referred to as multi-level memory cells. For example, a multi-level memory cell having three different threshold voltages can be programmed to be in any of four states, thereby storing two bits of data per cell and doubling the amount of data that can be stored in the memory cell.

Memory cells are typically arranged in a two-dimensional array of rows and columns, where the rows are coupled via an access line, often called a wordline, and the columns are coupled via a data line, often called a bitline. The wordlines and bitlines are used during data read and write functions to either select certain memory cells for reading or to select words and bits for writing or programming. During such read and write functions, factors such as induced electric or magnetic fields, capacitive coupling, and finite resistance of the conductors as well as insulators can cause unwanted coupling or interference between bitlines and wordlines.

The memory cells themselves are further subject to the resistance and capacitance of the bitlines and wordlines coupled to the memory cell for proper operation and communication with a memory controller. Device features, such as variation in the oxide layer thickness between the charge storage structure and the conduction region between the source and drain can also cause variation in the threshold voltage and other operating parameters of such a memory cell. Also, close physical proximity of memory cells in the memory array can result in coupling between charge storage structures, further influencing the operation of the memory cells. Factors such as these can be even more significant in multi-level flash memories having more than one threshold voltage per memory cell, as the difference between different data states becomes harder to accurately discern as the number of different states increases.

BRIEF DESCRIPTION OF THE FIGURES

FIG. 4 shows threshold voltage distributions for an array of nonvolatile memory cells and corresponding hard state read data, consistent with some example embodiments of the invention.

FIG. 5 is a table showing use of hard state and soft state data to determine the output of a memory cell read operation, consistent with some example embodiments of the invention.

FIG. 6 is a table showing soft bit determination based on the number of neighboring aggressor programmed memory cells, consistent with some example embodiments of the invention.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the various embodiments of the invention, which is defined only by the appended claims.

Figure 1:
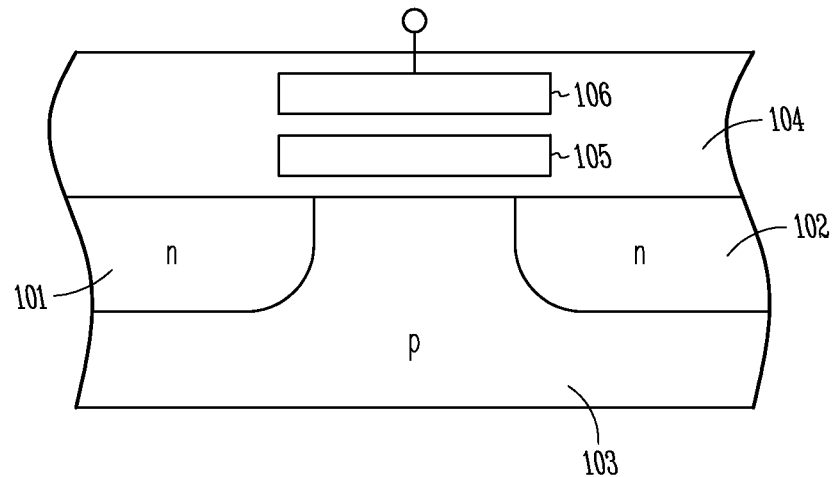
FIG. 1 is a cross-section view of a typical nonvolatile memory cell, as may be used to practice some embodiments of the invention.

FIG. 1 illustrates an example of a typical nonvolatile memory cell, which shares a basic structure with an electronically erasable programmable memory (EEPROM). A source 101 and drain 102 are formed on a substrate 103, such as a p-type semiconductor material. The source, drain, and substrate are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are typically added in small, controlled quantities to produce the desired hole or electron concentration in the semiconductor material, resulting in n-type material if a surplus of electrons are present, such as in the source 101 and drain 102, and resulting in p-type material if an excess of holes are present such as in the substrate material 103.

An insulator material such as silicon oxide (SiO2) is used to form an insulating layer 104, which has embedded within it a charge storage structure such as a floating gate 105, fabricated from a conductor such as metal or conductive polysilicon, and a control gate 106 similarly formed of a conductive material. The floating gate 105 is not directly electrically coupled to another conductive element of the memory cell, but is "floating" in the insulating material 104. The floating gate is separated from the region of the p-type substrate material 103 between the source 101 and the drain 102 by a thin insulative layer of controlled thickness, such as ten nanometers.

In operation, the floating gate 105 is able to store a charge due to its electrical isolation from other components of the memory cell. Programming or erasing a charge level on the floating gate 105 can be performed via a tunneling process known as Fowler-Nordheim tunneling, in which electrons tunnel through the oxide layer separating the floating gate 105 from the substrate 103. Most flash memory cells are categorized as either NOR flash or NAND flash, based on the arrangement of the memory cells or the circuitry used to perform write, read, and erase operations.

To program a data bit to a NOR flash memory cell or store a charge on its floating gate, the source 101 can be grounded and a supply voltage such as six volts can be applied to the drain 102. In one embodiment, the drain voltage is applied via a bitline used to identify the bit to be written. A higher voltage such as 12 volts is also placed on the control gate 106, forcing an inversion region to form in the p-type substrate due to the attraction of electrons to the positively charged control gate. The voltage difference between the source and drain in combination with the inversion region in the p-type material result in significant electron flow between the source 101 and drain 102 through the p-type substrate 103's inversion region, such that the kinetic energy of the electrons and the electric field generated by the control gate voltage at 106 result in Fowler-Nordheim tunneling of high-energy or "hot" electrons across the insulator and onto the floating gate 105.

The floating gate thereby adopts a negative charge that counteracts any control gate positive charge's effect on the region of the substrate 103 between the source 101 and drain 102, raising the memory cell's threshold voltage that must be applied to the control gate 106 via a wordline to result in conduction across an inversion region in the p-type substrate material 103. In other words, when the wordline's voltage is brought to a high voltage such as five volts during a read operation, the cell will not turn on due to the higher threshold voltage as a result of electrons stored on the floating gate 105 during the write operation. The read voltage applied to the control gate is larger than the threshold voltage (Vt) of an erased memory cell, but not large enough to allow conduction across a substrate 103 inversion region of a cell that has been written.

To program or write a NAND flash memory cell, the source 101 and drain 102 of the memory cell of FIG. 1 can be grounded, and the control gate 106 can be brought to a voltage of perhaps 20 volts. This voltage is significantly higher than the 12 volt control gate voltage used to program the same memory cell using NOR flash methods, because a higher voltage makes up for the absence of "hot" electrons slowing between the source and drain of the memory cell.

To erase a memory cell using typical NOR flash memory circuitry, a similar tunneling of electrons can take place from the floating gate 105 to the source 101 of the memory cell. The source 101 is in some embodiments more deeply diffused than the drain to enhance erase performance. A positive voltage such as twelve volts can be applied to the source 101, the control gate 106 can be grounded, and the drain 102 can be left disconnected to perform an erase operation in one example. The large positive voltage on the source 101 attracts the negatively charged electrons, causing them to tunnel through the insulating layer 104 and leave the floating gate 105. Because there is very little current flow between the source and drain during an erase operation, performing an erase operation takes very little current and consumes relatively little power.

In another example memory cell erase operation often used in NAND memory configurations, the source 101 and drain 102 can be left floating, but the substrate material 103 can be brought to a high positive voltage such as 20 volts, attracting the negatively charged electrons and causing them to tunnel from the floating gate 105 through the oxide insulating layer 104 to the substrate material 103. This method is sometimes known as "channel erase", because the channel substrate material 103 receives electrons from the floating gate.

Figure 2:
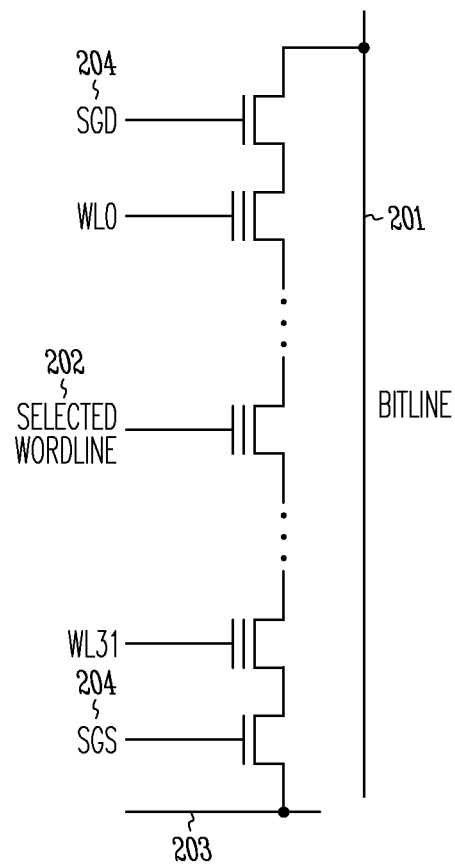
FIG. 2 is a schematic diagram of a typical string of nonvolatile memory cells in a NAND flash memory configuration, consistent with some example embodiments of the invention.

Memory cells such as that of FIG. 1 are often arranged in arrays that are addressed via access lines known as wordlines, and data lines known as bitlines, as shown in FIG. 2. FIG. 2 shows a portion of a NAND flash memory array coupled to a single bitline, where each of the memory cells shown in the bitline is further selectable via a wordline.

The bitline 201 is coupled to a series of charge storage memory cells coupled to wordlines 202, including in this example memory cells 0-31. The series of memory cells are connected on the other side of the series to source line 203, and can be selectively isolated from the source line 203 and bitline 201 by respective line select transistors 204.

To perform a read operation, the word line and therefore the control gate of the selected memory cell 202 can be maintained at a low but positive voltage level while the word lines of unselected memory cells can be brought to a sufficiently high voltage to cause the unselected memory cells to conduct irrespective of any charge that may be on the charge storage structures of the individual memory cells. If the selected memory cell has an uncharged charge storage structure it will activate as a result of the low positive voltage level on the control gate, but if the charge storage structure has a negative charge it will raise the threshold voltage of the memory cell 202 above the low positive voltage applied to the control gate such that the cell does not conduct. The state of the memory cell's charge storage structure can therefore be determined by monitoring conductivity or current flow between the bitline 201 and source line 203.

To perform a write operation, the bitline 201 and source line 203 are typically grounded via line select transistors 204 coupling the string to a grounded bitline 201 and source line 203. The gates of select transistors 204 are therefore again coupled to a voltage source such that the transistors conduct. The control gates of the memory cells not being written are brought to a sufficiently high voltage to cause the memory cells to conduct irrespective of their stored charges, such as ten volts. The selected memory cell 202's control gate is coupled to a significantly higher voltage, such as 20 volts. The voltage applied to the selected memory cell's control gate causes formation of an inversion region in the channel and tunneling of electrons due to the attraction of electrons to the positively charged control gate coupled to the 20 volt signal. The grounded source and drain in combination with the inversion region in the channel material provide a continuous source of electrons for tunneling in the memory cell's inversion region, such that electrons that tunnel onto the charge storage structure can be replaced by electrons from the grounded bitline and source lines.

As electrons tunnel through the oxide layer onto the charge storage structure, the charge storage structure's initial positive potential due to electric field coupling with the control gate reduces, thereby reducing the voltage difference between the charge storage structure and the conducting inversion region in the channel and slowing the tunneling of electrons onto the charge storage structure. Storage of electrons on the charge storage structure is therefore somewhat self-limiting, and is defined by factors such as electric field coupling between the control gate and charge storage structure, oxide thickness, variations in wordline voltage or bitline voltage, and stray electric fields or capacitance with other elements of the memory circuit. The resulting variation in charge storage structure charge results in variation in threshold voltage Vt of the written memory cells, which is undesirable due to the effect of variation in memory cell reliability and power consumption.

Charge storage in the charge storage structures of neighboring cells can also inadvertently change the functional threshold voltage of a cell, particularly if several neighboring cells are in a programmed state. When combined with other factors, such as capacitive coupling, temperature fluctuations, program/erase cycling, and storage of multiple bits of data per memory cell, the influence of neighboring charge storage structure can cause a cell to be misread.

Figure 3:
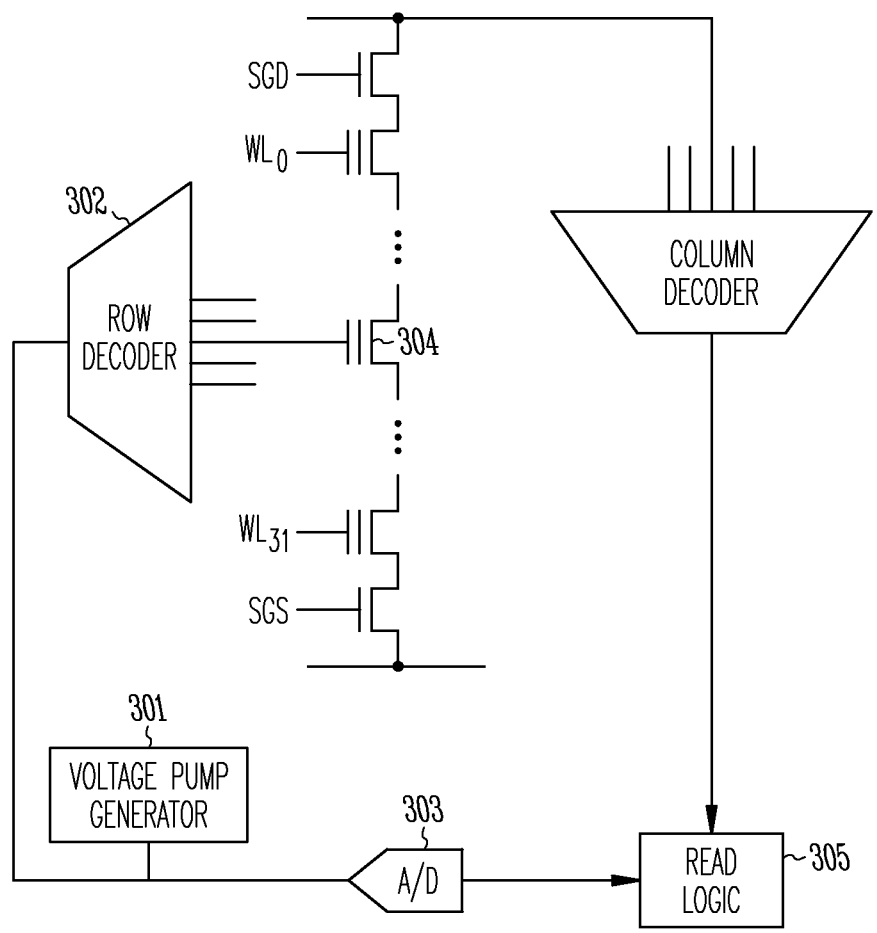
FIG. 3 is a schematic diagram of a voltage ramp-driven nonvolatile memory, consistent with some example embodiments of the invention.

While many flash memories use a comparator as part of the read logic coupled to a bitline to determine whether a cell conducts or does not conduct at a threshold voltage, FIG. 3 shows an alternate system in which the threshold voltage can be determined more exactly (for example, US Publication No. 2009/0141558A1). Here, a voltage ramp generator 301 generates a voltage ramp signal that is applied to a selected wordline via the row decoder 302, and to an analog-to-digital converter 303. When the memory cell 304 being read conducts, the read logic 305 detects both the conduction of the bitline and the output of the analog-to-digital converter, thereby determining the threshold voltage of the flash memory cell 304. In alternate embodiments, other methods of providing a similar function or result are employed, such as using a digital voltage ramp generator and converting the digital signal provided to the read logic to an analog voltage level provided to the row decoder and memory cell wordline.

The ability to differentiate between different threshold voltages using a memory system such as that shown in FIG. 3 facilitates not only more accurate determination of a cell's data state, but in various embodiments of the invention can be used for multi-level memory cell reading and writing, compensation for neighboring programmed memory cells, error correction estimation, and other such functions.

FIG. 4 shows a method of using a measured threshold voltage to determine possible data state outputs, consistent with an example embodiment of the invention. In this example, several "hard bits" of data are determined by evaluating the threshold voltage at which a memory cell being read conducts. The hard bit data as illustrated may be the least significant bit of a four-state multi-level cell as shown by the probability distribution lines in transition between states 01 and 00, or may be the transition between single programmed and unprogrammed states as shown by the dashed probability distribution lines. In either case, the hard bit data provided as output changes as the threshold voltage increases, such that the higher the threshold voltage becomes, the fewer hard bits are set to a logical one output value. The hard bits also change sequentially in this example, such that the third bit changes at the lowest threshold voltage in the transition range between data states, then the second, first, and zero bits in that order. The hard bits shown in FIG. 4 are in this embodiment not the direct measurement of a voltage ramp, but instead correspond to various voltage values on the voltage ramp within the region of likely observed threshold values considering the influence of factors such as neighboring programmed memory cells and other variables.

The hard bits determined as shown in FIG. 4 can then be used along with "soft bits" to more accurately determine an output that represents the true data state of the memory cell, as shown in FIG. 5. The soft bits represent the number of neighboring memory cells that are in a programmed state, such that they may inadvertently raise the threshold voltage of the cell being read. The soft bits can be determined via a read of the potential aggressor memory cells, where the data states of the potential aggressor cells are converted into soft bits using a buffer. For example, the read states of the aggressor cell(s) can be either converted into the soft bits using a buffer (e.g., in the case of dual side of full post-compensation) or used as the soft bits (e.g., single side post-compensation), and merged in the page buffer with the hard bits. In a more detailed example, two hard bits from each of three aggressor cell are downloaded from the array to the page buffer (e.g., in three separate reads), a SRAM is scanned to encode the six hard bits (from the aggressor cells) into two soft bits, which are then merged with the hard bits.

In this example, cells that are physically closest are viewed as having a greater influence or aggression in interfering with the cell being read than cells that are farther away. Cells that are diagonal from the cell being read are therefore not considered in this example, while cells that neighbor vertically or horizontally are considered as potential aggressors. FIG. 6 reflects how the number of neighboring programmed aggressors is encoded in a further example, with 11 representing no neighboring vertical or horizontal programmed memory cells, and 00 representing three or four neighboring vertical and horizontal programmed memory cells. The "output" column of FIG. 6 dictates which of the four hard bits read during the operation of FIG. 4 will best represent the true data state of the memory device based on the number of neighboring aggressors as encoded by the soft bits 5 and 6, as shown in more detail in FIG. 5.

Returning to FIG. 5, a table showing several example hard bit readings for various memory cells 500-504 is shown along with corresponding soft bit data and output data, consistent with an example embodiment of the invention. Looking first at the example of 501, the four hard bits are all ones, indicating the output will be a one irrespective of the soft bit values. Reading the soft bits at 501, the values of bits 5 and 6 are both one, which according to the table of FIG. 6 indicates low aggressor interference from neighboring memory cells, and indicates that hard bit 3 should be used to determine the output value.

Similarly, the soft bits of the flash memory cell read at 504 are both ones, also indicating that hard bit 3 should be used to determine the data state. At 504, this results in an output of zero, as only hard bit zero is set to a one value. Memory cell 503 has two hard bits that are one and two hard bits that are zero, and so the output will be a zero if there are one or fewer neighboring programmed aggressor memory cells, and will be a one if there are two or more neighboring programmed memory cells. Here, there is one neighboring programmed memory cell as reflected by the soft bits in FIG. 6, and so hard bit two which has a zero value is used to provide the output.

The data state of a memory cell can therefore be determined by using the number of aggressors surrounding the cell being read, such as by determining which hard bit should be used to provide the output by encoding the neighboring memory cell programmed states in soft bits, thereby changing the threshold position slightly near the area of transition as reflected by the hard bits table in FIG. 4 to compensate for the influence of neighboring memory cells.

In another embodiment, threshold voltage tracking, such as the example shown in FIGS. 4-6, can be used to estimate a probability or likelihood of influence from neighboring memory cells, and can be employed to provide error correction. For example, looking at the memory cell read at 502, we can see that with no neighboring aggressor cell influence the output would be a zero as reflected by hard bit three. But the presence of any neighboring aggressor cells indicates that the output should perhaps be a one, with increasing probability as the number of neighboring aggressors increases. Soft bits of 00 in this example would therefore indicate a relatively strong probability that what may have been read as a zero assuming no influence from neighboring aggressors should be an output value of one, providing an error correction circuit with information that may help resolve errors that could otherwise not be corrected.

The example of FIGS. 4-6 illustrates methods of compensating for aggressor or programmed neighboring memory cells to provide more accurate or reliable reading of programmed flash memory cells. Various embodiments include a variety of hardware and other features that may or may not be shown to implement such examples, such as a threshold voltage sense circuitry operable to determine the threshold voltage of a memory cell, and output compensation circuitry operable to determine a read output at least in part from programming states of at least one aggressor memory cell. In another example, compensation for neighboring programmed aggressor memory cells is applied during programming.

Figure 7:
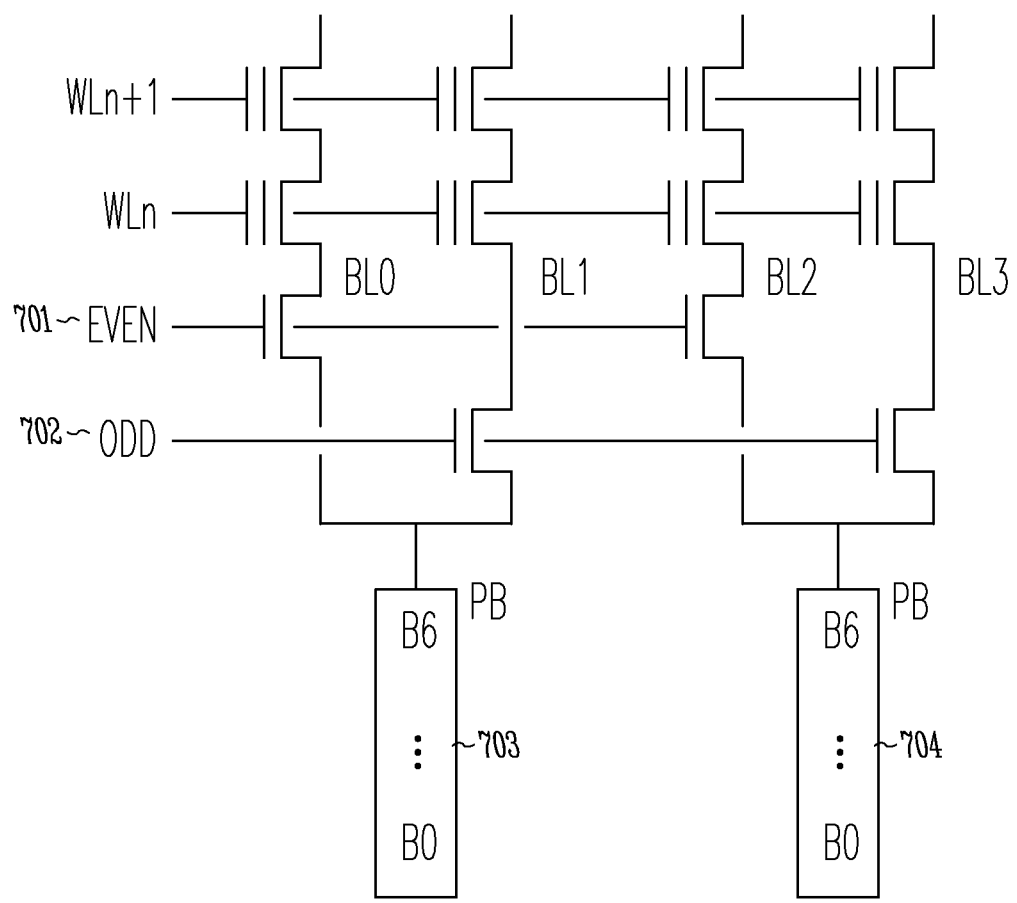
FIG. 7 is schematic diagram showing a even and odd pages of a memory coupled to multi-bit buffers, consistent with some example embodiments of the invention.

FIG. 7 shows an example memory system having a seven-bit page buffer, consistent with an example embodiment of the invention. Here, even and odd memory pages can be alternatively read using the even and odd line select transistors coupled to even select signal 701 and odd select signal 702. All the cells driven by a particular word line and selected by the even/odd select line transistors are in this example defined as a page of 8 kilobytes. The data stored in each memory cell comprises seven bits of data, as shown in the page buffers 703 and 704.

Figure 8:
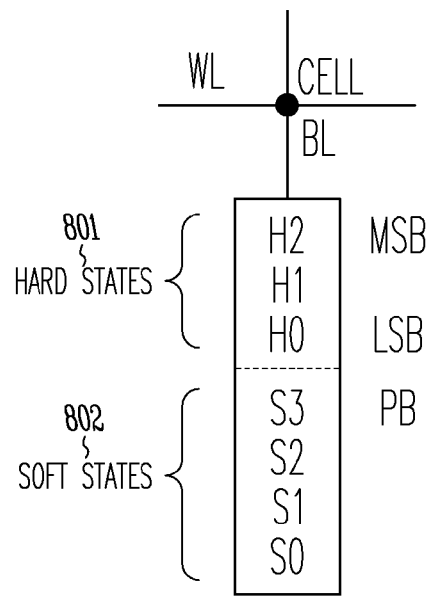
FIG. 8 is a block diagram showing use of a multi-bit buffer to store hard and soft memory state data, consistent with some example embodiments of the invention.

FIG. 8 shows a seven-bit page buffer in greater detail, consistent with an example embodiment of the invention. Here, three "hard bits" are used to store data, or to encode one of eight different data symbols, as shown at 801. The remaining four "soft bits" shown at 802 are used for neighboring aggressor memory cell compensation during programming. In an alternate example, the memory cells are not operated as multi-level cells, and only a single bit of "hard" data is used. The number of "soft" bits may be similarly varied in alternate embodiments, depending on the degree of compensation accuracy or resolution desired.

Figure 9:
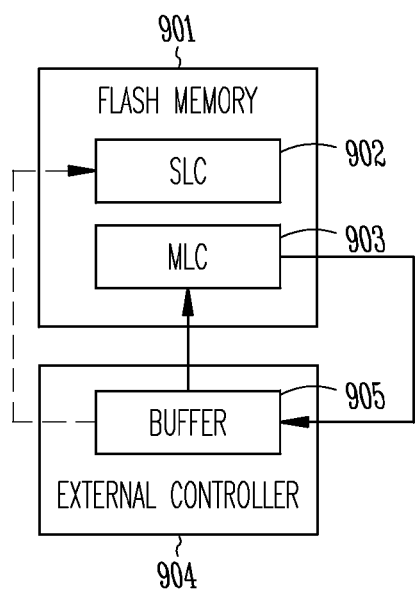
FIG. 9 is a block diagram of a multi-level nonvolatile memory system, consistent with some example embodiments of the invention.

FIG. 9 shows a block diagram of a flash memory, as may be used to practice some embodiments of the invention. A flash memory includes a single-level cell portion 902 and a multi-level cell portion 903. The single-level cell (SLC) portion of the memory can be used to store three pages in single-level cell mode temporarily, after which the three pages of data are combined and stored as a single page of data in the three bit per cell multi-level cell (MLC) portion of the flash memory.

In a more specific example, three pages of data can be written quickly and reliably to the single-level cell portion of the flash memory 902 by the controller 904. The three pages stored in the single-level cell portion are each associated with one of the three bits of each cell of the page of data to be written in the multi-level cell portion of the memory. The controller reads the three stored pages of data from the single-level cell portion and stores them in buffer 905, where they are combined and written to the multi-level cell portion of memory, such that each cell written in the multi-level cell portion 903 stores three bits of data, one from each of the three pages of data stored in the single-level cell memory 902 and buffered in the controller at 905.

Figure 10:
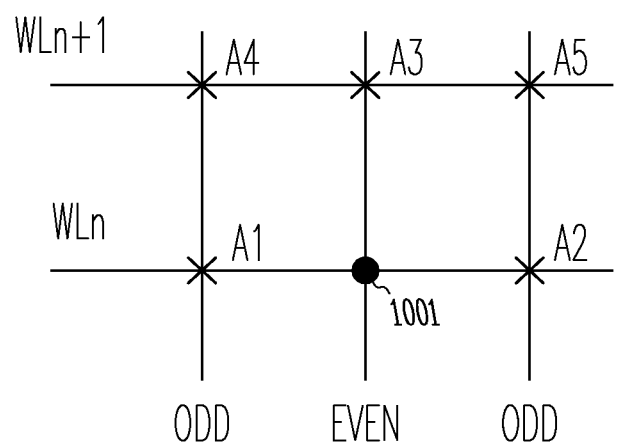
FIG. 10 is a diagram of a nonvolatile memory cell and neighboring aggressor nonvolatile memory cells, consistent with some example embodiments of the invention.

A memory cell with neighboring aggressor cells is shown in FIG. 10, consistent with an example embodiment of the invention. The cell 1001 in this embodiment is potentially affected by programmed states of charge storage structures of neighboring cells, including cells A1 and A2 to either side but in different pages, cell A3 which is in the same page but on a neighboring word line, and cells A4 and A5 which are both on neighboring word lines and a different page. Here, the neighboring cells A1 and A2 have charge storage structures that are nearer to the charge storage structure of the cell 1001, and so have a greater influence on the threshold voltage of cell 1001 than the other neighboring cells A3-A5. Cell A3 is also relatively near cell 1001, but somewhat farther from 1001 than cells A1 and A2, so the programmed state of its charge storage structure influences the threshold voltage of cell 1001 somewhat less than cells A1 and A2. Cells A4 and A5 are farther than cells A1-A3, and so in this example are not included in pre-compensation as their influence on cell 1001's threshold voltage is low.

If the target threshold voltage of 1001 is 3V, for example, and neighboring cells A1, A2, and A3 are programmed such that they contribute approximately one volt to the threshold voltage observed when reading cell 1001, cell 1001 will be programmed to a threshold voltage of approximately two volts so that when read it will appear to have the desired three volt threshold voltage.

Figure 11:
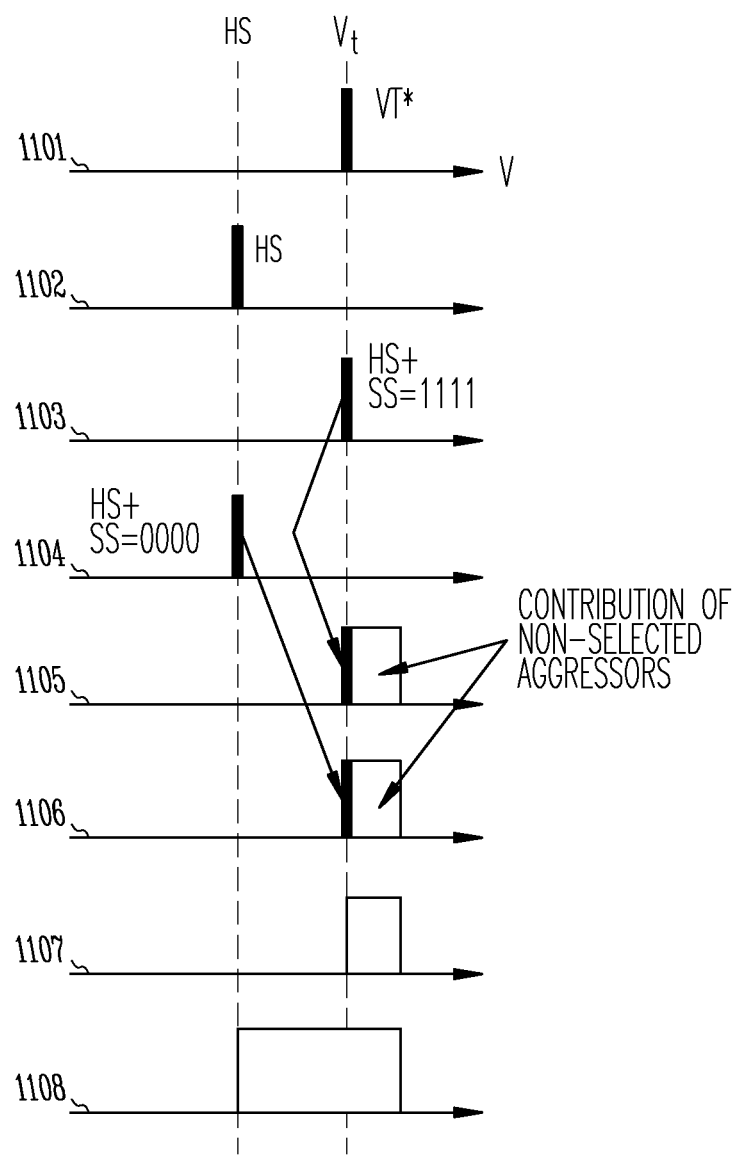
FIG. 11 is a threshold voltage diagram illustrating use of soft state aggressor programming data to reduce threshold voltage variance in programmed nonvolatile memory cells, consistent with some example embodiments of the invention.

FIG. 11 shows a more detailed example of threshold voltage pre-compensation, consistent with an example embodiment of the invention. The chart shown here illustrates how a desired threshold voltage Vt as shown at 1101 is achieved by using a hard state (HS) programmed voltage as shown at 1102 with soft state (SS) compensation during programming. The hard state voltage level shown at 1102 is selected such that the hard state threshold voltage plus the influence of all compensated aggressors in their programmed states (such as programmed to their highest charge state in some multi-level embodiments) results in a threshold voltage of the desired Vt. This is shown at 1103, such that the hard state shown at 1102 plus a soft state of 1111, indicating no aggression by neighboring memory cells, results in a programmed threshold voltage of Vt.

If there are programmed aggressor memory cells, the soft state will be less than 1111, resulting in a somewhat reduced programmed threshold voltage. When the selected flash memory cell is read, the influence of the aggressor memory cells makes up for the reduction in programmed threshold voltage, resulting in an effective threshold voltage near Vt. This is shown at 1104, where the soft state 0000 results in programming the cell to a threshold voltage of HS, such that the aggressors will bring the observed threshold voltage up from the HS voltage to Vt.

Some uncertainty may remain in the threshold voltage due to non-compensated aggressor cells, but as shown at 1105 and 1106, the level of uncertainty is the same irrespective of the soft state value or the aggressor state of the compensated aggressors. The end result is that aggressor compensation reduces the level of uncertainty in threshold voltage as a result of neighboring programmed memory cells from the voltage range shown at 1108 to the voltage range shown at 1107. This improvement can be used to provide more data states or more bits of data per cell, reduce the number of read errors in a memory, or otherwise improve memory performance.

Figure 12:
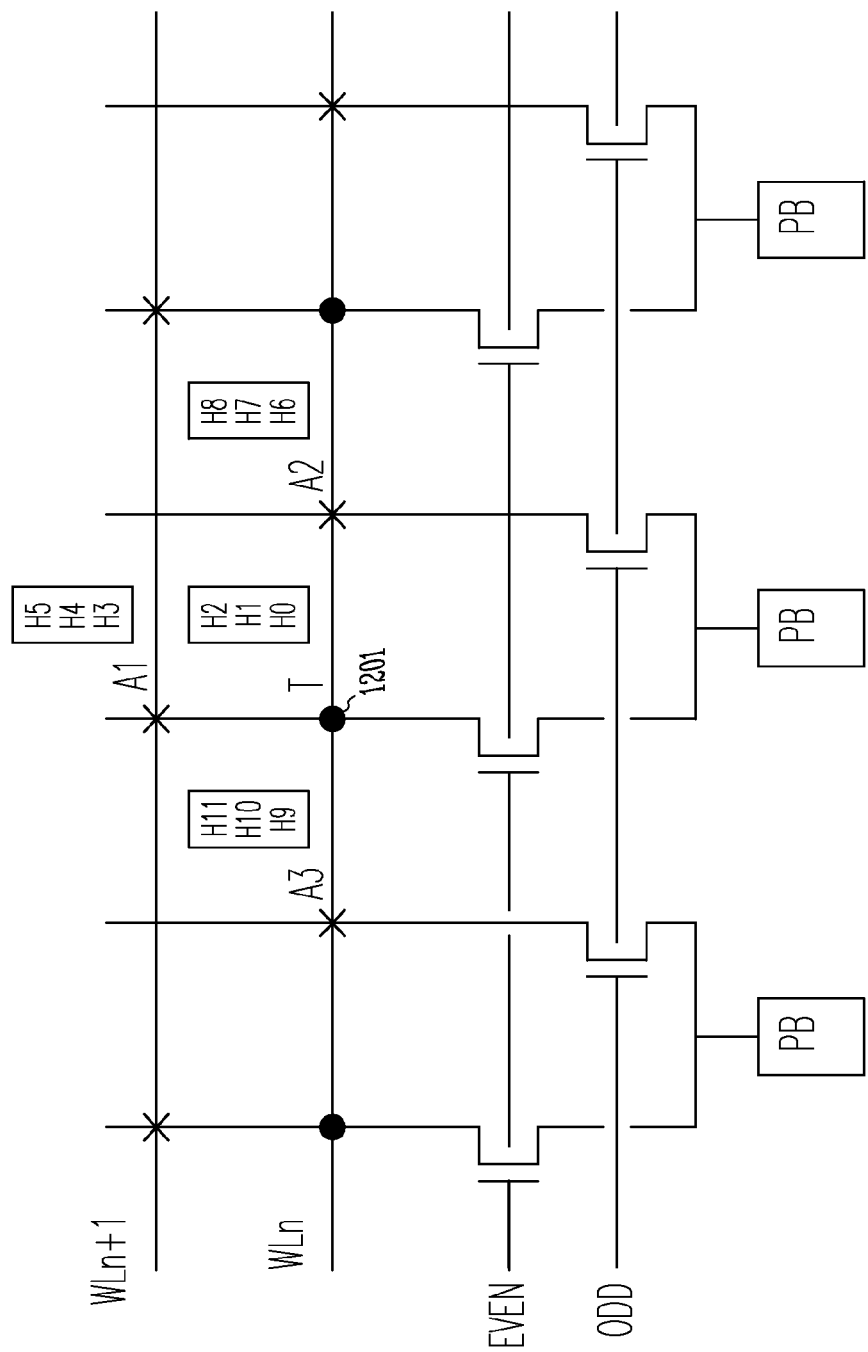
FIG. 12 is a schematic diagram of a nonvolatile memory cell and neighboring aggressor nonvolatile memory cells, consistent with some example embodiments of the invention.

The soft state bits are determined in the above example by observing the hard state programming data of neighboring cells, as shown in FIG. 10. FIG. 12 shows a more detailed example of determining soft state bits for a cell being programmed, consistent with an example embodiment of the invention. Here, cell 1201 is being programmed, and the soft bits are determined using the hard state bits of neighboring cells A1, A2, and A3. In this example, the hard states of the aggressors A1-A3 are applied to a lookup table to output the soft state bits to compensate the programmed state of cell 1201. In alternate embodiments, only higher order bits of the aggressors are used, such as H5 and H4 of cell A1, or fewer or more neighboring aggressor memory cells are included in the compensation calculations.

Because the page buffer in this example allows for four soft bits, the two most significant bits of each neighboring cell, or four possible data states per neighboring cell, can be added to produce a compensation value ranging from 0-12. This can be encoded/expanded to four bits ranging from encoded values of 0-16 using a lookup table, such that if the added hard state bits are a 12 the encoded soft state is 16. In an alternate embodiment, the total number of hard bits from potential aggressors is encoded to form the soft state, such as where three hard bits or 16 possible states per neighboring cell are added to produce a compensation value of 48 possible states. This compensation value is reduced to one of 16 states by using a lookup table or dividing by three, such that the resulting reduced value can be encoded by the soft bits 0000-1111.

Evaluation of neighboring aggressor memory cell states to generate soft bits used in programming a cell such as 1201 uses knowledge of the neighboring aggressor memory cell states before the cell 1201 is programmed. In one example, programming logic loads the desired page or pages of memory into the hard bit locations of an buffer such as an SRAM or page buffer, and the soft bits are determined from the hard bits using a lookup table and written to the buffer such as by sequentially scanning the memory cells and deriving soft bit data from neighboring cells. The buffered page data can then be written to the memory pages, including both the hard bit data and soft bit compensation data.

Programmable threshold voltages in some embodiments are used to provide a greater percentage of change in voltage from threshold voltage to threshold voltage in a multi-level cell flash memory. The programmed state of the flash memory is in this example embodiment a 7-bit encoded value, resulting in as many as 128 different possible threshold voltage states in a multi-level cell. Some technologies are currently limited to less than 16 threshold states or 3-4 bits of data, such as the three hard state bits of previous examples.

Figure 13:
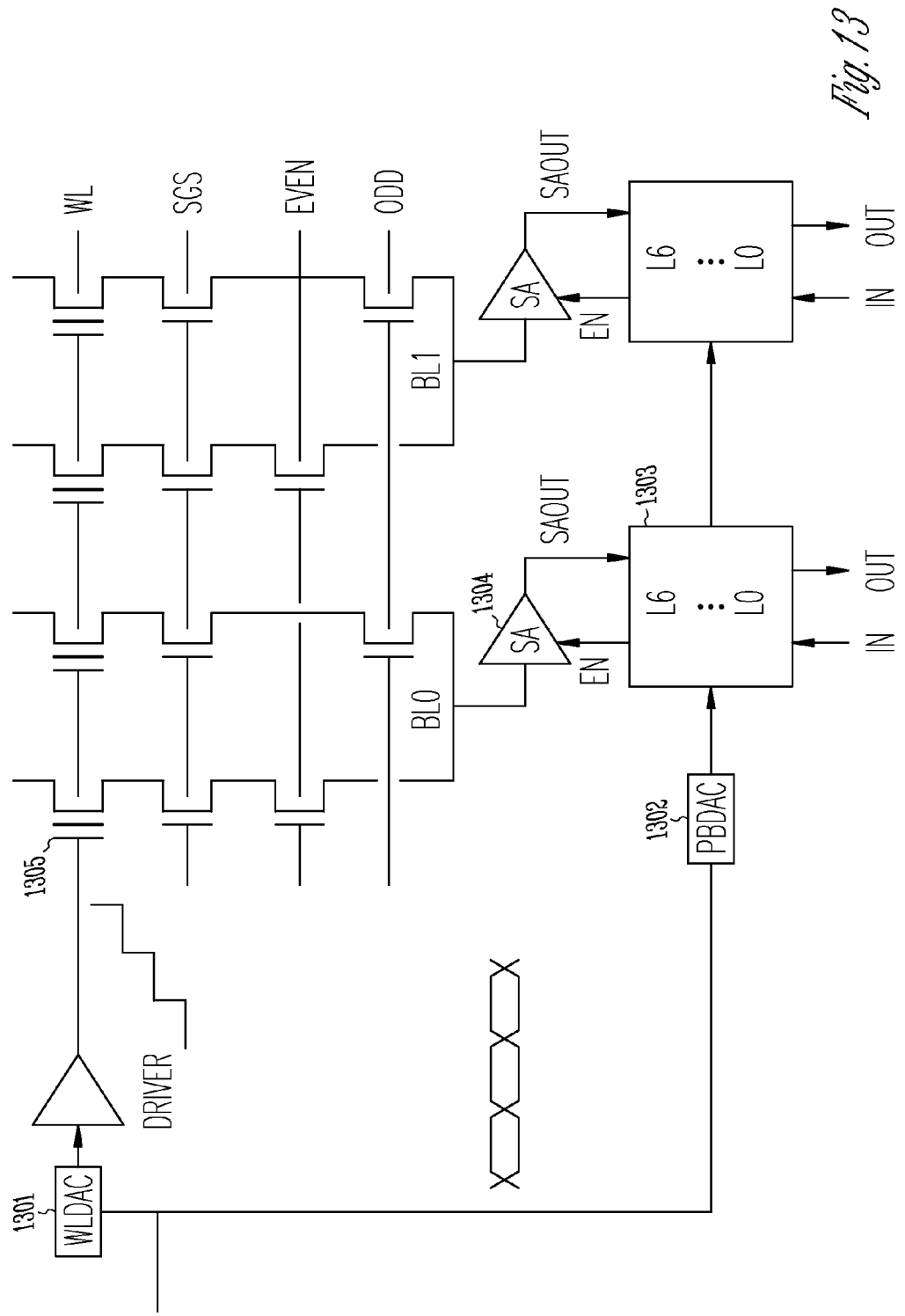
FIG. 13 is a schematic diagram of a digital signal-ramped nonvolatile memory, consistent with some example embodiments of the invention.

FIG. 13 shows an example flash memory with a placeable threshold voltage, consistent with some embodiments of the invention. Here, a word line DAC 1301 receives a digital signal and converts it to an analog ramping voltage signal applied to the word line of a cell to be programmed. The word line voltage ramp is also fed to a page buffer DAC 1302, which is connected to a page buffer 1303. The page buffer is coupled to a sense amplifier designed to detect whether current is flowing in the NAND flash string, indicating that the threshold voltage for the flash memory cell 1305 has been reached.

The page buffer 1303 stores the target threshold value of the cell 1305 if being written, or is used to latch the observed threshold value of the flash memory cell 1305 if being read. A comparator compares the value stored in the latches L0-L6 in the page buffer 1303 with the value received from the page buffer DAC 1302, enabling the page buffer to read or write a data value to the flash memory cell 1305.

To perform a read operation, the word line DAC 1301 is incremented to produce an analog voltage ramp applied to the cell to be read at 1305. During each step of the word line DAC, the sense amplifier monitors for conduction. If the NAND string fails to conduct, it is due to the raised threshold voltage of the programmed flash memory cell 1305 from the charge stored on its charge storage structure, and the cell is determined to be programmed to at least the threshold voltage of the current DAC signal. Once the NAND string conducts, the threshold voltage has been reached, and can be determined by the page buffer DAC level and latched in the page buffer latches 1303. The value stored in the page buffer 1303 is in this example then output as the observed threshold voltage of the cell.

To perform a program operation, the page buffers 1303 are stored with the value to be written to the flash memory cells such as 1305. A first programming pulse is applied to the control gate of the memory cell 1305 at a voltage level that should not cause the threshold voltage of the memory cell to exceed the lowest threshold voltage of a target programmed data state of a multi-level cell. A read operation is then performed as described above to verify the threshold level to which the cell is programmed. If the cell is not programmed to the desired threshold voltage, an additional programming pulse, including optionally a higher voltage or longer length pulse, is applied and the threshold voltage is rechecked. This process is repeated until the read operation confirms that the cell is programmed to the desired threshold voltage, at which point the bitline is inhibited during future programming pulses to prevent further programming of the cell 1305.

Figure 14:
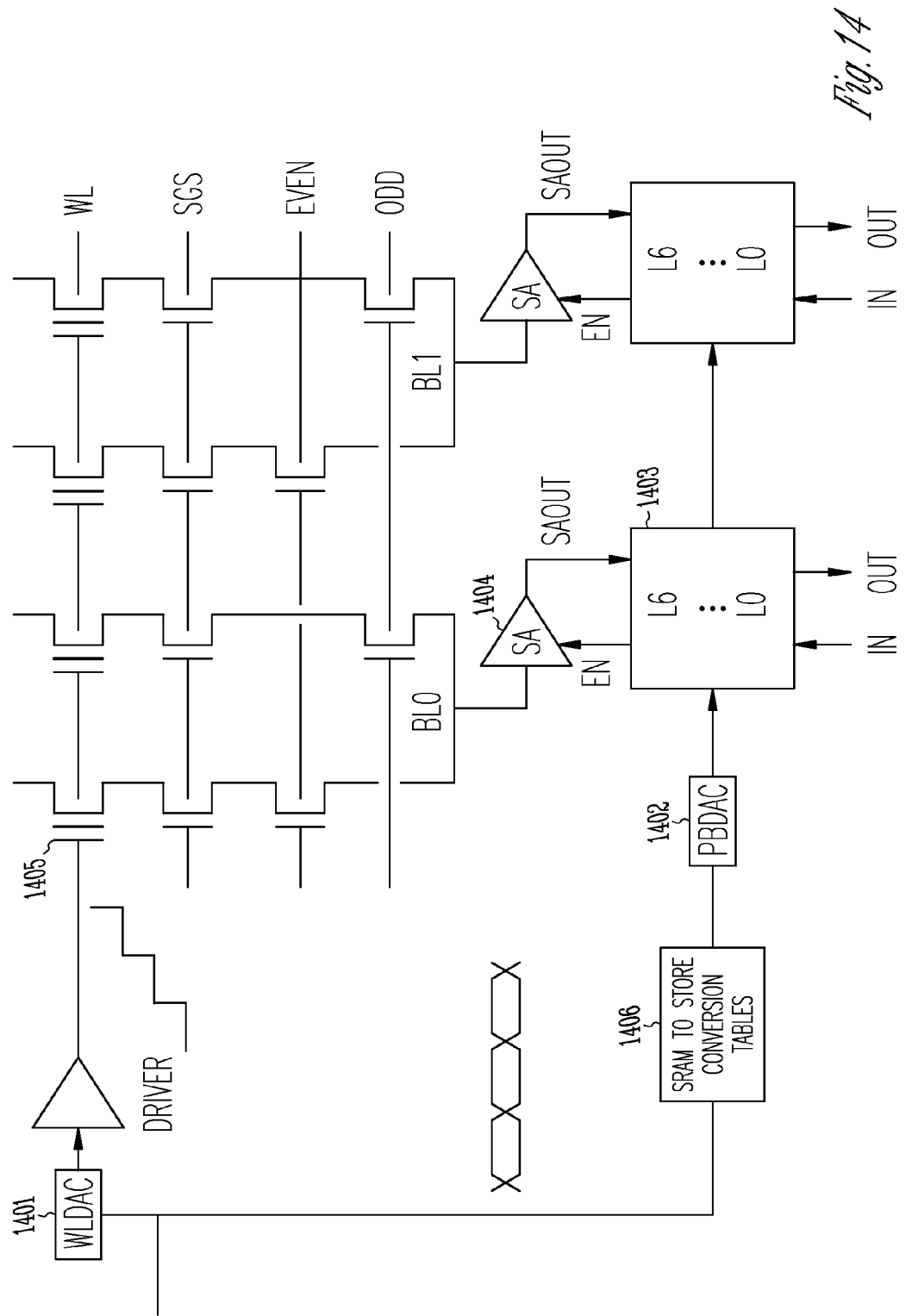
FIG. 14 is a schematic diagram of a digital signal-ramped nonvolatile memory including a conversion table enabling programmable threshold voltages, consistent with some example embodiments of the invention.

This system is modified in the example of FIG. 14, in which the word line DAC 1401 and the page buffer DAC 1402 are separated by an element such as an SRAM or lookup table that stores a conversion table. This enables threshold values to have a distribution other than the linear voltage increment between threshold voltages provided by the system of FIG. 13, providing for improved reliability, encoding of more information per multi-level cell, reduction in influence of parasitic coupling in the array, and other such benefits depending on the threshold voltage placement.

Consider as an example a three-bit system having eight data states or programmable threshold levels, with target threshold voltages from one volt to eight volts. In the system of FIG. 13, the difference between adjacent threshold voltages is approximately equal, placing the eight threshold voltage levels at 1, 2, 3, 4, 5, 6, 7, and 8 volts. By using the SRAM lookup table 1406, the page buffer 1403 stores not the threshold value Vt, but the value from the SRAM lookup table that is determined from the threshold voltage Vt, enabling the threshold voltage corresponding to different programmed data states to be varied according to the needs of the memory system by specifying the programmed data state corresponding to various threshold voltages in the SRAM lookup table 1406.

For example, threshold voltages may be distributed such that the percentage change in voltage is similar from data state to data state, rather than decreasing as the threshold voltage rises. In a more detailed example, the eight data state voltages from one volt to eight volts as discussed in the example of FIG. 13 are now distributed as 1, 1.35, 1.81, 2.44, 3.28, 4.42, 5.95, and 8 volts, such that the target voltage of each data state is approximately 1.346 times the target voltage of the next lower data state. In other examples, other distributions such as a Fibonacci series or polynomial series are used. For example, a threshold voltage Vt=a+ a*2^1+a*2^2+ . . . a*2^n, where n is one of the eight data states encoded in the cell in a more detailed embodiment.

The memory of FIG. 14 operates the same as the memory of FIG. 13, but performs threshold voltage encoding internally such that no external encoding or decoding of threshold voltages is needed to provide a non-linear threshold voltage distribution. This simplifies implementation of programmable threshold voltages, as the improved circuit of FIG. 14 can be simply substituted for the circuit of FIG. 13 with no external changes in programming or control needed.

The example systems shown here illustrate how threshold voltages in a flash memory can be controlled in a system that allows threshold voltage placement, to provide more reliable operation and reduce the influence of factors such as neighboring programmed memory cells and parasitic coupling. Pre-compensation and post-compensation of threshold voltage for neighboring programmed "aggressor" memory cells has been shown, reducing the threshold voltage uncertainty in a memory system. Use of a data structure or lookup table to provide programmable threshold voltage distributions was also shown, enabling the distribution of threshold voltages in a multi-level cell flash memory to be tailored to provide more reliable operation. Examples such as these may be incorporated into a memory, a memory controller, electronic devices such as a smart phone or solid state storage, or other such devices.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method of operating a memory, comprising:
providing an analog ramp signal to a control gate of a memory cell;
converting a value of a digital signal corresponding to the analog ramp signal to a converted digital value; and
providing the converted digital value to a buffer coupled to the memory cell, wherein a difference between the converted digital value and the digital signal value results in a difference in threshold voltage in the memory cell.

2. The method of operating a memory of claim 1, wherein the digital signal corresponding to the analog ramp signal is coupled to a digital-to-analog converter coupled to a select line to provide the analog ramp signal to the control gate of the memory cell.

3. The method of operating a memory of claim 1, wherein there is a greater voltage difference between high threshold voltage data states than low threshold voltage data states in the memory cell.

4. The method of operating a memory of claim 1, wherein providing the converted digital value to a buffer comprises providing the converted digital value to a buffer operable to be selectively coupled to the memory cell via a sense amplifier.

5. The method of operating a memory of claim 1, wherein converting a value of a digital signal comprises converting the value of the digital signal using a data structure.

6. The method of operating a memory of claim 1, wherein the memory comprises a memory chip, a memory card, a smart phone, or a solid state storage device.

7. The method of operating a memory of claim 1, wherein converting a value of a digital signal comprises converting the value of the digital signal using a look up table.

8. The method of operating a memory of claim 1, wherein a converted digital value corresponds to a target threshold voltage of a data state, and wherein a target threshold voltage of each data state is a specified constant multiplied by a target threshold voltage of its next lower data state.

9. The method of operating a memory of claim 1, including incrementing a word line digital to analog converter (DAC) to produce the analog ramp signal, and wherein providing an analog ramp signal includes providing the analog ramp signal to a control gate of a multi-level memory cell.

10. The method of operating a memory of claim 1, wherein providing the converted digital value to a buffer includes providing the converted digital value to a page buffer DAC coupled to the memory cell.

11. A memory, comprising:
a memory cell having a control gate operable to receive an analog ramp signal;
conversion logic operable to receive a digital signal corresponding to the analog ramp signal, wherein the conversion logic is operable to convert a value of the digital signal to a converted digital value; and
a buffer operable to receive the converted digital value, the buffer further operable to be selectively coupled to the memory cell, wherein the difference between the converted digital value and the digital signal value results in a difference in threshold voltage in the memory cell.

12. The memory of claim 11, wherein the digital signal corresponding to the analog ramp signal is coupled to a digital-to-analog converter coupled to a select line to provide the analog ramp signal to the control gate of the memory cell.

13. The memory of claim 11, further comprising a sense amplifier coupled to the buffer and operable to be selectively coupled to the memory cell.

14. The memory of claim 11, wherein the conversion logic comprises a buffer having a data structure.

15. The memory of claim 11, wherein the conversion logic is operable to provide a greater voltage difference between high threshold voltage data states than low threshold voltage data states in the memory cell.

16. The memory of claim 11, wherein the memory comprises a memory chip, a memory controller, a memory card, or a solid state storage device.

17. The memory of claim 11, wherein the conversion logic comprises a buffer having a look up table.

18. The memory of claim 11, wherein a converted digital value corresponds to a target threshold voltage of a data state, and wherein the conversion logic is operable to provide converted digital values so that a target threshold voltage of each data state is a specified constant multiplied by a target threshold voltage of its next lower data state.

19. The memory of claim 11, including a word line digital to analog converter (DAC) operable to produce the analog ramp signal, wherein the memory cell is a multi-level memory cell operable to receive the analog amp signal from the word line DAC.

20. The memory of claim 11, wherein the buffer includes a page buffer DAC coupled to the memory cell.

* * * * *